(12) United States Patent
Givens

(10) Patent No.: US 6,790,764 B2
(45) Date of Patent: *Sep. 14, 2004

(54) PROCESSING METHODS FOR PROVIDING METAL-COMPRISING MATERIALS WITHIN HIGH ASPECT RATIO OPENINGS

(75) Inventor: John H. Givens, San Antonio, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/359,330

(22) Filed: Feb. 5, 2003

(65) Prior Publication Data

US 2003/0113994 A1 Jun. 19, 2003

Related U.S. Application Data

(63) Continuation of application No. 09/900,116, filed on Jul. 6, 2001, now Pat. No. 6,537,903, which is a continuation of application No. 09/191,931, filed on Nov. 13, 1998, now Pat. No. 6,274,253.

(51) Int. Cl.$^7$ .......................................... H01L 21/4763
(52) U.S. Cl. ..................... 438/622; 438/642; 438/650; 438/652; 438/674; 438/687; 438/688; 427/97; 427/99; 204/192.1
(58) Field of Search ............................... 438/622, 642, 438/650, 652, 674, 687, 688; 427/97, 99; 204/192.1

(56) References Cited

U.S. PATENT DOCUMENTS

| | | | |
|---|---|---|---|
| 5,658,438 A | | 8/1997 | Givens et al. |
| 5,877,084 A | | 3/1999 | Joshi et al. |
| 5,877,086 A | | 3/1999 | Aruga |
| 5,932,289 A | | 8/1999 | Dobson et al. |
| 6,057,231 A | * | 5/2000 | Givens et al. ............... 438/644 |
| 6,060,386 A | * | 5/2000 | Givens ........................ 438/626 |
| 6,274,253 B1 | * | 8/2001 | Givens ........................ 428/622 |
| 6,537,903 B2 | * | 3/2003 | Givens ........................ 438/622 |

OTHER PUBLICATIONS

Z. Shterenfeld–Lavie et al.; "A 3–Level, 0.35um, interconnection process using an innovative, high pressure aluminum plug technology": Jun. 1995; pp. 31–37.

H. J. Barth et al.; "Integration Aspect of a Hi–Fill Barrier With a High Pressure Aluminum Contact Fill"; Jun. 1995; pp. 52–58.

* cited by examiner

Primary Examiner—Bret Chen
(74) Attorney, Agent, or Firm—Wells St. John P.S.

(57) ABSTRACT

In one aspect, the invention includes a processing method, comprising: a) providing a substrate having a high aspect ratio opening therein; b) forming a metal-comprising layer over the opening; c) providing a first pressure against the metal-comprising layer; and d) ramping the pressure that is against the metal-comprising layer to a second pressure at a rate of from about 1 atmosphere per second about 100 atmospheres per second. In another aspect, the invention includes a processing method, comprising: a) providing a substrate having a high aspect ratio opening therein, the opening having a widest portion and a width at said widest portion; b) in a first chamber, sputter depositing a metal to form a metal-comprising layer over the opening, the metal-comprising layer having a thickness that is at least about twice the width of the opening; c) transferring the substrate to a second chamber having a first pressure therein; and d) while the substrate is within the second chamber, ramping the pressure within the second chamber at a rate of at least about 20 atmospheres per second to a second pressure.

22 Claims, 2 Drawing Sheets

PROCESSING METHODS FOR PROVIDING METAL-COMPRISING MATERIALS WITHIN HIGH ASPECT RATIO OPENINGS

This application is a continuation of Ser. No. 09/900,116 filed Jul. 6, 2001 now U.S. Pat. No. 6,537,903, which is a continuation of 09/191,931 filed Nov. 13, 1998 now U.S. Pat. No. 6,274,253.

TECHNICAL FIELD

The invention pertains to methods of forming metal-comprising materials within openings, and has particular utility for methods of forming metal-comprising materials within openings having aspect ratios of greater than or equal to about 6:1.

BACKGROUND OF THE INVENTION

Continuing goals in semiconductor fabrication processes are to decrease the amount of semiconductor wafer real estate consumed by electrical components, and to decrease the amount of semiconductor wafer real estate consumed by electrical interconnects between components. A method of reducing real estate consumed by electrical components and interconnects is to form the components and interconnects within vertical openings having high aspect ratios. For purposes of interpreting this disclosure and the claims that follow, a high aspect ratio opening is defined as an opening having an aspect ratio of greater than or equal to about 6:1.

Electrical components and interconnects can comprise metal-comprising materials, such as, for example, aluminum, aluminum alloys, tungsten, or titanium. It is difficult to provide such metal-comprising materials uniformly within high aspect ratio openings. For instance, if it is attempted to deposit such metal-comprising materials into a high aspect ratio opening, the materials will frequently form a bridge over the opening, rather than filling the opening. Methods have been developed for pushing bridging material into an opening by applying a substantially static high pressure to the material to drive it into the opening. Such methods work acceptably for openings having aspect ratios of less than 6:1, but frequently will not adequately drive metal-comprising materials into openings having aspect ratios greater than or equal to 6:1. Accordingly, it is desired to develop alternative methods for providing metal-comprising materials within high aspect ratio openings.

SUMMARY OF THE INVENTION

In one aspect, the invention encompasses a method of providing a metal-comprising material in a high aspect ratio opening. A substrate having a high aspect ratio opening extending therein is provided. A metal-comprising layer is formed over the opening. A first pressure is provided against the metal-comprising layer. The pressure against the metal-comprising layer is ramped to a second pressure at a rate of from about 1 atmosphere per second to about 100 atmospheres per second to force the metal-comprising layer into the opening.

In another aspect, the invention encompasses a method of providing a metal-comprising material in a high aspect ratio opening. A substrate having a high aspect ratio opening extending therein is provided. The opening has a widest portion and a width at said widest portion. A metal is sputter-deposited in a first chamber to form a metal-comprising layer over the opening. The metal-comprising layer has a thickness that is at least about twice the width of the opening. The substrate is transferred to a second chamber having a first pressure therein. While the substrate is within the second chamber, the pressure within the second chamber is ramped at a rate of at least about 20 atmospheres per second to a second pressure to force the metal-comprising layer into the opening.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8)

Figure 1:
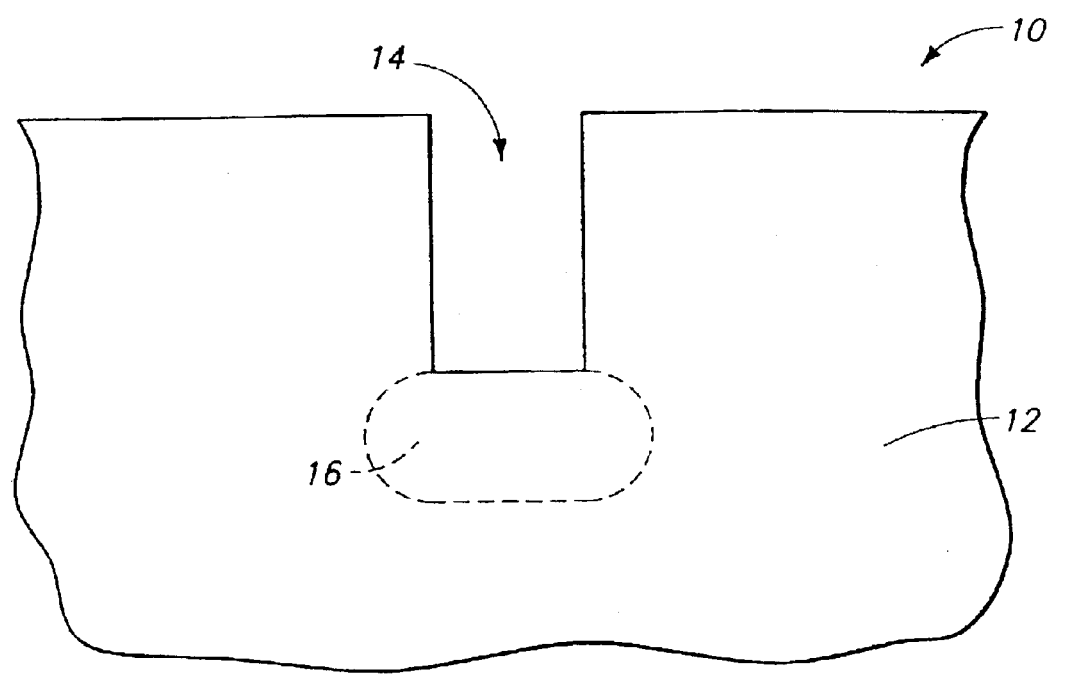
FIG. 1 is a fragmentary, diagrammatic, cross-sectional view of a semiconductor wafer fragment at a preliminary processing step of a method of the present invention.

A processing method of the present invention is described with reference to FIGS. 1–3. Referring to FIG. 1, a semiconductor wafer fragment 10 comprises a substrate 12 having an opening 14 formed therein. Substrate 12 can comprise, for example, monocrystalline silicon lightly doped with a p-type conductivity enhancing dopant. Alternatively, substrate 12 can comprise, for example, an insulative material, such as silicon dioxide or borophosphosilicate glass (BPSG). To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Opening 14 extends to an electrical node 16. Electrical node 16 can comprise, for example, a conductively doped diffusion region within a semiconductive substrate 12, or a metal layer within an insulative substrate 12.

Opening 14 preferably comprises a high aspect ratio (i.e., an aspect ratio of equal to or greater than about 6:1). Also, opening 14 comprises a critical dimension, which is defined as a minimum width across the opening. For example, opening 14 can comprise a circular horizontal cross-sectional shape, with a diameter corresponding to the critical dimension. Opening 14 will have a preferred high aspect ratio if it has a depth that is at least about six times greater than its critical dimension.

Figure 2:
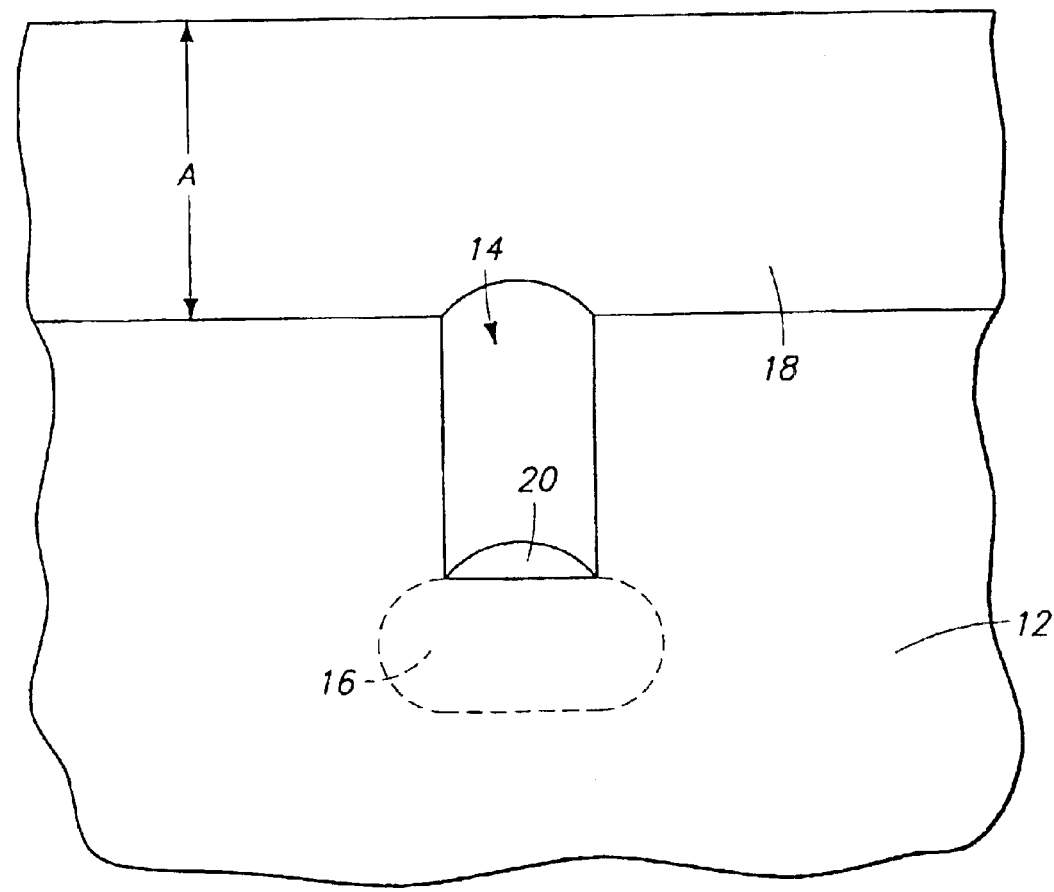
FIG. 2 is a view of the FIG. 1 wafer fragment shown at a processing step subsequent to that of FIG. 1.

Referring to FIG. 2, a metal-comprising layer 18 is provided over substrate 12, and over opening 14. Layer 18 can be deposited by, for example, sputter deposition. Metal-comprising layer 18 can comprise, for example, elemental aluminum, aluminum alloys, or other conductive metallic materials, such as for example, materials comprising silver or copper. Preferably, the metallic materials of layer 18 have a melting temperature of less than or equal to about 1500° C. If layer 18 comprises elemental aluminum, or aluminum alloys, layer 18 is preferably provided over a layer of titanium nitride. Such layer of titanium nitride can be formed by, for example, chemical vapor deposition to extend over substrate 12 and within opening 14. An advantage of providing titanium nitride beneath an aluminum-comprising layer is that the titanium nitride can function as a "glue layer" to assist in adhering the aluminum-comprising layer to substrate 12. Also, a layer of titanium can be formed beneath the layer of titanium nitride. An advantage of providing titanium under the titanium nitride is that the titanium can provide a good electrical connection to node 16.

Occasionally, as shown, a portion 20 of the material of layer 18 enters high aspect ratio opening 14. In many instances, a substantial portion of opening 14 remains void of the metal-comprising material of layer 18. Instead of filling high aspect ratio opening 14, layer 18 forms a bridge over the opening.

Metal-comprising layer 18 has a thickness "A." Also, opening 14 comprises a width. If opening 14 is not cylindrical, the opening can comprise a plurality of different widths, with one of the widths corresponding to a widest portion of opening 14. If opening 14 is cylindrical, the width will be equivalent throughout opening 14 and will be equal to a diameter of the cylindrical opening 14. For purposes of interpreting this disclosure, the "widest portion" of a cylindrical opening is defined as a diameter of the opening. Most preferably, thickness "A" is greater than the width of opening 14 at the widest portion of opening 14. Such relationship of the thickness of metal-comprising layer 18 to a width of opening 14 enables layer 18 to completely fill opening 14 when it is forced within the opening. Preferably, thickness "A" is at least about twice a critical dimension of the width of opening 14.

Figure 3:
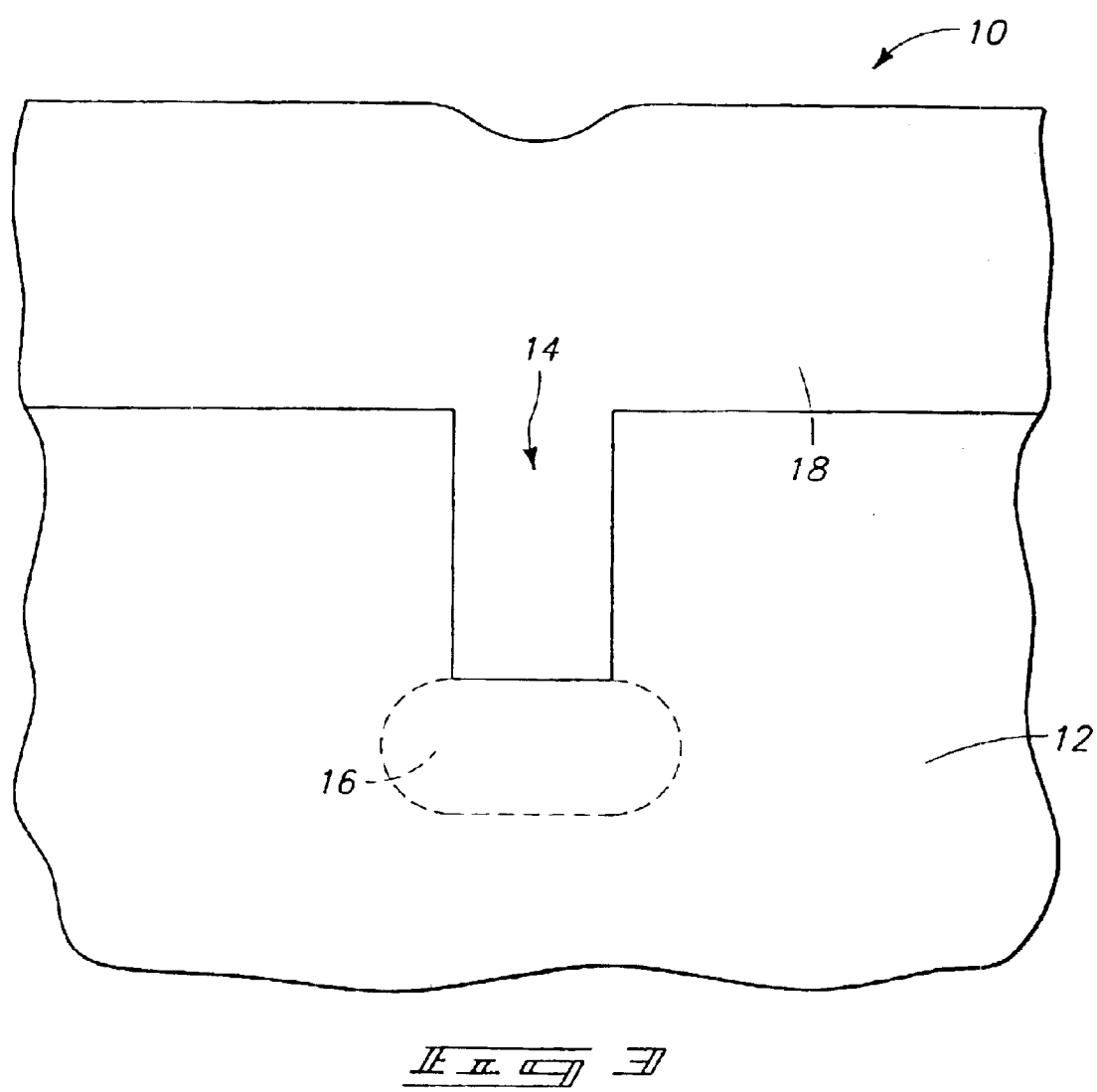
FIG. 3 is a view of the FIG. 1 wafer fragment shown at a processing step subsequent to that of FIG. 2.

Referring to FIG. 3, a bridging portion of metal-comprising layer 18 is forced within opening 14. Such forcing occurs by providing wafer 10 within a reaction chamber having a first pressure against metal-comprising layer 18, and increasing the pressure at a rate of from about 1 atmosphere per second to about 100 atmospheres per second to a second pressure. The second pressure is then maintained for a time of from about 1 second to about 120 seconds. Metal-comprising layer 18 is driven within opening 14 during either the ramping of the pressure, or the maintaining of the second pressure. Preferably, water fragment 10 will be maintained at a temperature of from about 400° C. to about 500° C., and more preferably at about 480° C., during the ramping of pressure and the maintaining of the second pressure. The first pressure against metal-comprising layer 18 can comprise, for example, 1 atmosphere. The second pressure against metal-comprising layer 18 can comprise, for example, a pressure of from about 600 atmospheres to about 1000 atmospheres, and preferably comprises a pressure of about 700 atmospheres. A suitable device for accomplishing the above-described processing conditions is described in article entitled *A 3-Level, 0.35 micrometer interconnection process using an innovative high pressure aluminum plug technology*, by Z. Shterenfeld-Lavie, et. al., from the Jun. 27–29, 1995 VMIC Conference (1995 ISMIC).

A preferred rate at which a pressure against metal-comprising layer 18 is ramped varies according to the dimensions of opening 14. If opening 14 comprises an aspect ratio of less than 7:1, the pressure against metal-comprising layer 18 is preferably ramped at a rate of at least about 20 atmospheres per second. On the other hand, if opening 14 comprises an aspect ratio of greater than 10:1, the pressure against metal-comprising layer 18 is preferably ramped at a rate of greater than or equal to 35 atmospheres per second.

In preferred methods of the present invention, metal-comprising layer 18 is forced into opening 14 at a sufficient rate that opening 14 is filled within a period of less than 2 seconds, and more preferably a period of less than 1 second, from a time that a pressure ramp against layer 18 is initiated. Example conditions for accomplishing such preferred filling of an opening 14 comprising a depth of less than or equal to about 2.4 microns and a critical dimension of greater than or equal to about 0.35 microns is a ramp rate of greater than or equal to about 20 atmospheres per second. If opening 14 comprises a depth of less than or equal to about 3 microns and a critical dimension of greater than or equal to about 0.25 microns, a preferred ramp rate is greater than 35 atmospheres per second. If opening 14 comprises any of (1) a depth of less than or equal to about 4 microns and a critical dimension of greater than or equal to about 0.35 microns; (2) a depth of less than or equal to about 2 microns, and a critical dimension of greater than or equal to 0.15 microns; or (3) a depth of less than or equal to about 1 micron and a critical dimension of greater than or equal to about 0.1 microns, the pressure against metal-comprising layer 18 will preferably be ramped at a rate of at least about 35 atmospheres per second.

In an exemplary embodiment of the invention, metal-comprising layer 18 is formed by sputter deposition in a first reaction chamber. The wafer comprising fragment 10 is then transferred to a second reaction chamber wherein the wafer is placed in an ambient which is non-reactive with exposed portions of substrate 12, and non-reactive with exposed portions of metal-comprising layer 18. A suitable ambient is, for example, an ambient consisting essentially of argon. A pressure within the second reaction chamber is then ramped at a rate of at least about 20 atmospheres per second to force metal-comprising layer 18 into an high aspect ratio opening within substrate 12.

The method of the present invention can advantageously fill openings having high aspect ratios with a metal-comprising layer in times of 120 seconds or less. While not intended to be bound by any particular mechanism, it is suggested that the process by which metal-comprising layer 18 is forced into high aspect ratio opening 14 can comprise a solid transfer process. Specifically, it is suggested that a temperature at an interface of substrate 12 and metal-comprising layer 18 may increase rapidly during a rapid pressure ramp of the present invention. Processing conditions of the present invention are preferably adiabatic, such that a temperature within a processing chamber comprising wafer 10 is expected to increase approximately linearly with pressure due to the relationship expressed by the ideal gas equation (the temperature will increase exactly linearly with pressure if the gases within the chamber behave as ideal gases). The ideal gas equation is PV=nRT, wherein P is pressure, V is volume, n is the moles of gas, R is a gas constant (8.3144 Joule/K-mole), and T is temperature.

As the temperature increases, a localized temperature gradient can form such that a thin portion of metal-comprising layer 18 adjacent the interface with substrate 12 can melt to form a lubricating liquid film. The lubricating liquid film can then enable the bridge of metal-comprising layer 18 to slip into opening 14. It is noted that chemical analysis of a portion of metal-comprising layer 18 forced within opening 14 reveals that the vast majority of metal-comprising layer 18 within opening 14 has not melted during the forcing into opening 14. In fact, there is generally no indication of a melted and re-solidified portion of metal-comprising layer 18 within opening 14. Such, however, does not preclude the above-discussed mechanism whereby a very thin portion of metal-comprising, layer 18 melts to form a very thin lubricating surface.

It is advantageous that the vast majority of metal-comprising layer 18 does not melt and re-solidify upon its transfer into opening 14. Such melting and re-solidification could adversely affect conductivity and other physical properties of the portion of metal-comprising layer 18 forced within opening 14.

After metal-comprising layer 18 is forced within high aspect ratio opening 14, subsequent processing (not shown) can be utilized to incorporate metal-comprising layer 18 into integrated circuitry as, for example, either an electrical interconnect or an electrical component.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:

providing a semiconductor substrate having an electrical node, and a high aspect ratio opening extending to the node;

forming an adhesion layer within the opening;

forming a metal-comprising layer bridge across the opening; and exposing the metal-comprising layer bridge to a pressure ramp rate of from about 1 atmosphere per second to about 100 atmospheres per second to transfer metal of the metal-comprising layer from the bridge into the opening.

2. The method of claim 1 wherein the metal-comprising layer comprises one or more metals selected from the group consisting of aluminum, copper and silver.

3. The method of claim 1 wherein the opening extends through an electrically insulative material.

4. The method of claim 1 wherein the adhesion layer comprises titanium nitride and the metal-comprising layer contains aluminum.

5. The method of claim 4 further comprising forming titanium within the opening prior to forming the adhesion layer.

6. The method of claim 1 wherein the ramping rate is greater than 10 atmospheres/second.

7. The method of claim 1 wherein the substrate is maintained at a temperature of from about 400° C. to about 500° C. during the exposure to the pressure ramp rate, and wherein the metal-comprising layer has a melting temperature of less than or equal to 1500° C.

8. The method of claim 1 wherein a pressure on the metal-comprising layer bridge ramps from about 1 atmosphere to at least 800 atmospheres during the exposure to the pressure ramp rate.

9. A semiconductor processing method, comprising:

providing a semiconductor substrate having an electrical node, and a high aspect ratio opening extending to the node;

forming a metal-comprising bridge across the opening, the metal of the bridge comprising one or more of aluminum, silver and copper; and exposing the metal-comprising bridge to a pressure ramp rate of from about 1 atmosphere per second to about 100 atmospheres per second to transfer metal from the bridge into the opening.

10. The method of claim 9 wherein the ramping rate is greater than 10 atmospheres/second.

11. The method of claim 9 wherein the substrate is maintained at a temperature of from about 400° C. to about 500° C. during the exposure to the pressure ramp rate and wherein the metal-comprising bridge has a melting temperature of less than or equal to 1500° C.

12. The method of claim 9 wherein the opening has a widest portion and a width at said widest portion, and wherein the metal-comprising bridge has a thickness over the opening that is at least twice the width at the widest portion of the opening.

13. The method of claim 9 wherein the forming the metal-comprising bridge comprises sputter deposition.

14. The method of claim 9 wherein the substrate comprises monocrystalline silicon, and the node comprises a conductively-doped diffusion region within the monocrystalline silicon.

15. The method of claim 9 wherein the a pressure against the metal-comprising bridge ramps from about 1 atmosphere to at least 600 atmospheres during the exposure to the pressure ramp rate.

16. A semiconductor processing method, comprising:

providing a semiconductor substrate having an electrical node, and an opening extending to the node;

depositing a metal-containing bridge across the opening; and exposing the bridge to a pressure ramp rate of from about 1 atmosphere per second to about 100 atmospheres per second to transfer metal from the bridge into the opening.

17. The method of claim 16 wherein the ramping rate is greater than 10 atmospheres/second.

18. The method of claim 16 wherein the substrate is maintained at a temperature of from about 400° C. to about 500° C. during the exposure to the pressure ramp rate and wherein the bridge has a melting temperature of less than or equal to 1500° C.

19. The method of claim 16 wherein the opening has a widest portion and a width at said widest portion, and wherein the bridge has a thickness over the opening that is at least twice the width at the widest portion of the opening.

20. The method of claim 16 wherein the bridge comprises at least one of aluminum, copper and silver.

21. The method of claim 16 wherein the substrate comprises monocrystalline silicon, the node comprises a conductively-doped diffusion region within the monocrystalline silicon, the bridge comprises aluminum, and an adhesion layer is formed within the opening prior to depositing the bridge.

22. The method of claim 16 wherein the a pressure against the bridge ramps from about 1 atmosphere to at least 600 atmospheres during the exposure to the pressure ramp rate.

* * * * *

UNITED STATES PATENT AND TRADEMARK OFFICE
CERTIFICATE OF CORRECTION

PATENT NO.      : 6,790,764 B2
APPLICATION NO. : 10/359330
DATED           : September 14, 2004
INVENTOR(S)     : Givens It is certified that error appears in the above-identified patent and that said Letters Patent is hereby corrected as shown below:

Title Page, ABSTRACT, line 7
Insert --to-- after "second".

Col. 3, line 45,
Replace "water"
With --wafer--.

Col. 5, line 66, claim 8,
Replace "800"
With --600--.

Col. 6, line 30, claim 15,
Delete "the".

Col. 6, line 63, claim 22,
Delete "the".

Signed and Sealed this

Eighteenth Day of September, 2007

JON W. DUDAS
*Director of the United States Patent and Trademark Office*